US012604432B2

(12) United States Patent (10) Patent No.: US 12,604,432 B2
Altman et al. (45) Date of Patent: Apr. 14, 2026

(54) MODULAR ENCLOSURES FOR COMPONENT COOLING

(71) Applicant: Ice Qube, Inc., Greensburg, PA (US)

(72) Inventors: Ridge Altman, Greensburg, PA (US); Jared Skoloda, Greensburg, PA (US)

(73) Assignee: Ice Qube, Inc., Greensburg, PA (US)

( * ) Notice: Subject to any disclaimer, the term of this patent is extended or adjusted under 35 U.S.C. 154(b) by 43 days.

(21) Appl. No.: 18/141,857

(22) Filed: May 1, 2023

(65) Prior Publication Data

US 2023/0354546 A1 Nov. 2, 2023

Related U.S. Application Data

(60) Provisional application No. 63/337,120, filed on May 1, 2022.

(51) Int. Cl.
H05K 7/20 (2006.01)
H05K 5/02 (2006.01)
H05K 5/04 (2006.01)

(52) U.S. Cl.
CPC ....... H05K 7/20136 (2013.01); H05K 5/0213 (2013.01); H05K 5/04 (2013.01)

(58) Field of Classification Search
CPC ..... H05K 7/20136; H05K 5/0213; H05K 5/04
USPC ........................................ 361/690
See application file for complete search history.

(56) References Cited

U.S. PATENT DOCUMENTS

2004/0023614 A1 2/2004 Koplin
2005/0162836 A1* 7/2005 Briggs ................. H05K 7/1424
361/724

2012/0090869 A1* 4/2012 Bumeder ................. H02B 1/54
174/50
2013/0300266 A1* 11/2013 Ramey ............... H05K 7/20745
312/236
2014/0001932 A1* 1/2014 Westby .................... H02B 3/00
312/223.1
2015/0173253 A1* 6/2015 Lewis, II ............. H05K 7/1488
312/223.2
2017/0346054 A1 11/2017 Elkins
2019/0182987 A1* 6/2019 Chen .................. H05K 7/20736

FOREIGN PATENT DOCUMENTS

DE 102015202602 A1 * 8/2016 ........ H01M 10/6566
JP 2015065714 A 4/2015
KR 19980016246 U 6/1998
(Continued)

OTHER PUBLICATIONS

Shult, International Preliminary Report on Patentability for PCT/US2023/020590, Nov. 13, 2024 (5 pages).
(Continued)

*Primary Examiner* — Zhengfu J Feng
(74) *Attorney, Agent, or Firm* — Gabriel & Co; Andrew M. Gabriel

(57) ABSTRACT

An embodiment provides an enclosure, including: a frame system comprising one or more frame components forming an internal skeleton; the one or more frame components having a first rigidity; and an external shell comprising one or more shell components that are configured to reversibly attach to the frame system; the one or more shell components having a second rigidity, the second rigidity being lower than the first rigidity. Other features may be disclosed or claimed.

11 Claims, 9 Drawing Sheets

(56) References Cited

FOREIGN PATENT DOCUMENTS

| KR | 20080086363 A | 9/2008 |
| KR | 20190141543 A | 12/2019 |

OTHER PUBLICATIONS

Lee, International Search Report for PCT/US2023/020590, Sep. 1, 2023 (10 pages).

* cited by examiner

Computer 601

CPU
610

622

Memory Controller
(MMU/DMA)
640

RF
(WIFI, 4G)
620

Memory
(ROM/RAM/
EEPROM/FLASH/
CACHE)
650

I/O
Interfaces
630

600

MODULAR ENCLOSURES FOR COMPONENT COOLING

CROSS-REFERENCE TO RELATED APPLICATIONS

This application claims the benefit of U.S. provisional patent application, Ser. No. 63/337,120, filed 1 May 2022, the content of which is incorporated by reference herein.

BACKGROUND

Enclosures such as metal cabinets are used to house components such as electronics or industrial equipment in a variety of indoor and outdoor settings such as factories, manufacturing facilities, free standing units, cellular base stations, etc. Conventionally, the enclosure is formed to protect the components from environmental conditions such as precipitation and the elements. One or more cooling units such as air conditioners, venting or fan systems, and heat exchangers, or combinations thereof, provide active cooling, e.g., closed-loop cooling in the case of an air conditioner. Therefore, the enclosures may be considered cooling units for use in industrial applications.

BRIEF SUMMARY

In summary, one embodiment provides an enclosure for cooling heat generating components. The enclosure may include one or more modular components or features. In one embodiment, an enclosure is provided with a cooling unit to form a cooling system or unit.

An embodiment provides an enclosure, comprising: a frame system comprising one or more frame components forming an internal skeleton; the one or more frame components having a first rigidity; and an external shell comprising one or more shell components that are configured to reversibly attach to the frame system; the one or more shell components having a second rigidity, the second rigidity being lower than the first rigidity.

Another embodiment provides a system, comprising: an enclosure, including: a frame system comprising one or more frame components forming an internal skeleton; the one or more frame components having a first rigidity; and an external shell comprising one or more shell components that are configured to reversibly attach to the frame system; the one or more shell components having a second rigidity, the second rigidity being lower than the first rigidity; and one or more of an air conditioning unit, a heat exchanger, and a filtered fan system.

A further embodiment provides a method, comprising: providing an enclosure, including: a frame system comprising one or more frame components forming an internal skeleton; the one or more frame components having a first rigidity; and an external shell comprising one or more shell components that are configured to reversibly attach to the frame system; the one or more shell components having a second rigidity, the second rigidity being lower than the first rigidity; and attaching one or more of an air conditioning unit, a heat exchanger, and a filtered fan system to a panel of the one or more shell components.

The foregoing is a summary and thus may contain simplifications, generalizations, and omissions of detail; consequently, those skilled in the art will appreciate that the summary is illustrative only and is not intended to be in any way limiting.

For a better understanding of the embodiments, together with other and further features and advantages thereof, reference is made to the following description, taken in conjunction with the accompanying drawings. The scope of the invention will be pointed out in the appended claims.

BRIEF DESCRIPTION OF THE DRAWINGS

FIG. 1 illustrates an example enclosure.

DETAILED DESCRIPTION

Figure 1A:
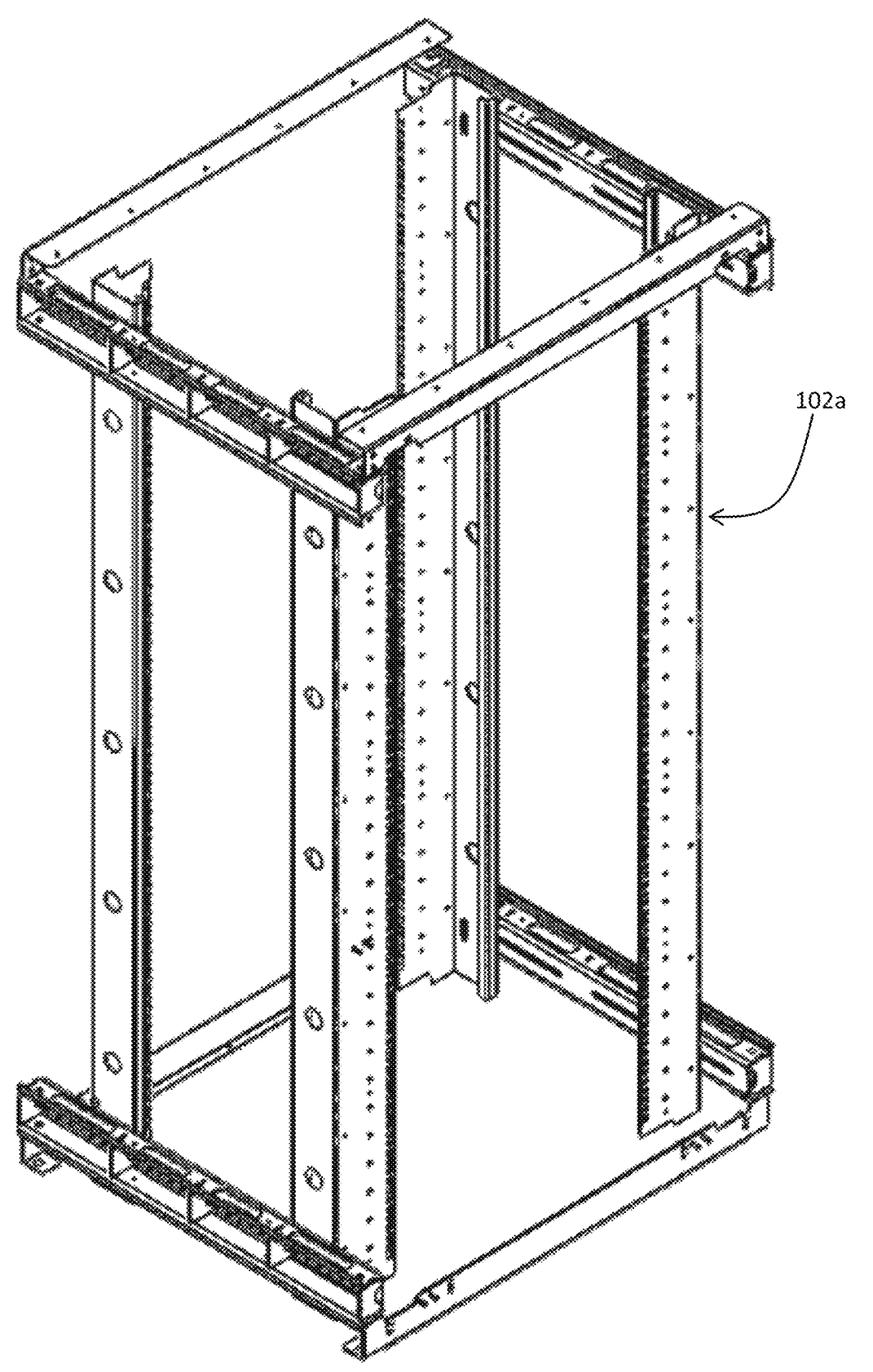
FIG. 1A illustrates a skeletal structure.

It will be readily understood that the components of the embodiments, as generally described and illustrated in the figures herein, may be arranged and designed in a wide variety of different configurations in addition to the described example embodiments. Thus, the following more detailed description of the example embodiments, as represented in the figures, is not intended to limit the scope of the claims, but is merely representative of those embodiments.

Reference throughout this specification to "embodiment(s)" (or the like) means that a particular feature, structure, or characteristic described in connection with the embodiment is included in at least one embodiment. Thus, appearances of the phrases "according to embodiments" or "in an embodiment" (or the like) in various places throughout this specification are not necessarily all referring to the same embodiment.

Furthermore, the described features, structures, or characteristics may be combined in any suitable manner in one or more embodiments. In the following description, numerous specific details are provided to give a thorough understanding of example embodiments. One skilled in the relevant art will recognize, however, that aspects can be practiced without one or more of the specific details, or with other methods, components, materials, etc. In other instances, well-known structures, materials, or operations are not shown or described in detail to avoid obfuscation.

It may be desirable to provide an enclosure to house heat generating components to be cooled. To facilitate an enclosure configuration that can accommodate many possible applications, efforts have been made to permit enclosures to be formed together in a modular fashion, e.g., one enclosure attached to or connected to another, increasing the effective size of the system. However, conventionally such enclosures suffer from various disadvantages such as heavy weight due to materials utilized in construction (e.g., all steel construction) and cumbersome or complicated attachment or fixing mechanisms, such as use of a connecting collar.

In an embodiment, a lightweight, strong enclosure configured for modular applications is provided. In one example, an aluminum housing material is utilized for an external shell of the enclosure, for example 0.125 inch thick aluminum sheet material, which is reinforced with an internal skeleton structure, for example made of steel or polymer or polymer composite, thus reducing the weight of the enclosure while maintaining its strength.

In an embodiment, the use of a connecting collar is avoided due to the rigidity of the frame system components, having first, higher rigidity, imparted to the aluminum walls of the external shell components, having a second, lower rigidity as compared to the first rigidity, such as ⅓ the first rigidity. For example, the external shell components may be less rigid due to their composition of aluminum sheet material (e.g., Young's modulus of about 10 million PSI) when compared to the higher rigidity of the internal skeleton structure composed of steel (e.g., Young's modulus of about 29 million PSI). This permits one or more of the enclosure walls to feature an aperture or cutout that facilitates use of a cover plate or the removal of the cover plate for securing another enclosure thereto, e.g., via screws, bolts or other securing mechanism and a thin sealing material such as rubber or similar material to create an impermeable barrier without the use of a connecting collar or similar structural arrangement. In this regard, more than one enclosure may be directly connected, e.g., via securing a first enclosure's frame to a second enclosure's frame, with or without an intervening panel of exterior shell, such as by use of bolts, screws, etc.

In an embodiment, an enclosure is formed with a lower portion that features a battery box or similar sub-section. For example, a battery box is formed in-line with the main walls of the enclosure such that a battery may be placed within the battery box. The battery box at the lower portion of the enclosure is likewise formed with an internal skeletal structure and aluminum walls such that it is strong, for example being able to accommodate up to 2500 pounds of load within the enclosure.

In an embodiment an upper portion of the enclosure may feature one or more fans or impellers that facilitate air circulation in a directional manner, e.g., from below the enclosure, through a main chamber thereof (and thus around and among the heat generating components, conducting heat upwards) and out to ambient. In an embodiment a door or side panel may be formed with louvers, backed by one or more filters as described herein, and permit air travel upward through the enclosure housing to an upper section having fans or other air moving mechanism.

In an embodiment, an upper sub-section or portion is included like the sub-section at the lower portion of the enclosure. In an embodiment, the upper portion may include one or more fans, impellers or air circulating mechanism to facilitate air removal from the interior of the enclosure while allowing the enclosure to remain free from environmental contaminates such as precipitation, water, dust or dirt. In one example, a heat exchanger may be included in the upper sub-section in the upper portion of the enclosure.

In an embodiment, one or more compartments, e.g., a main portion of the enclosure, an upper portion of the enclosure, etc., is configured to resist entry of environmental contaminates, permitting compliance with various standards such as NEMA types 12, 3R, 4, 4X, and IP66 seals. In one example, the enclosure includes one or more baffles placed between an opening or louvers of a vent portion and a fan arrangement in the upper portion of the enclosure. In one example, the enclosure includes one or more filters placed between an opening or louvers of an air intake, outlet, or vent portion and a fan arrangement, e.g., placed in the upper portion of the enclosure. In one example, the one or more filters may be selected from electrostatically charged filters, a minimum efficiency reporting value (MERV) filter or predetermined rating, e.g., 1-4, 6, 8, 10, 12, 14, or 16, and a hydrophobic filter. In an example, more than one filter or filter type may be used in combination, e.g., a different location or at similar location arranged in series.

In one example, a roof or upper wall of the enclosure includes an overhang on one or more sides to facilitate draining or runoff of precipitation without entry into the enclosure. In one example, the upper wall or roof of the enclosure includes one or more components in a modular or removable fashion, e.g., a fan system may be formed as integral to the upper wall or roof such that it may be attached in place as the roof of the unit.

In an embodiment, one or more walls of the enclosure may be formed of aluminum and include one or more components in a modular or removable fashion. For example, an enclosure may include a wall unit with an air conditioner, heat exchanger, filtered fan or other similar component mounted thereto such that the wall unit may be installed on the side of the enclosure in lieu of attaching another enclosure thereto.

In an embodiment, the enclosure features a removable door that includes a safety mechanism preventing unauthorized removal. In one example, one or more lifting brackets for lifting the enclosure into place double as door security stops. This arrangement prevents the door from being able to be removed from the enclosure unless it is opened at a predetermined angle, e.g., 90-degree angle, allowing one to lift the door up into the lifting bracket slot. In an embodiment, a locking mechanism for example offered by the lifting brackets may act to provide structural support, for example to prevent warping, for example of the external shell components.

These and other various features of the example embodiments will be more readily understood by reference to the figures, which are provided by way of example. The scope of the claimed embodiments will be pointed out in the appended claims.

Referring to FIG. 1, an example enclosure 100 is illustrated in perspective view. The enclosure 100 is configured to include a main chamber or area 105 that is suitable for housing heat generating components to be cooled. The enclosure 100 is formed with an outer shell of material such as sheet aluminum, for example as indicated at door 101 with an internal skeleton structure or frame system of more rigid material, for example steel or polymer composite, a portion of which is indicated at 102. In one example, the enclosure includes upper and lower sub-sections 104, 106, respectively. It is noted that either of the upper sub-section 104 or lower sub-section 106 may be omitted or provided in a different form, e.g., as further described in connection with lower sub-section 106 in connection with FIG. 5.

In an embodiment, the enclosure 100 is modular in that various components are interchangeable and enclosures may be connected to one another. For example, in addition to upper and lower sub-sections 104, 106, side panel components are modular and removable or interchangeable. By way of example, door 102 may be removed, e.g., when opened a predetermined angle as described further in connection with FIG. 5. Further, aperture 103 formed in side wall(s) of the housing of enclosure 100 may be fitted with panels such as a blank panel, a blank panel with vent, a panel with cooling component(s) integrated or removably attached, or fitted to another enclosure in series.

Enclosure 100 may include an upper sub-section 104 that includes an air circulation mechanism, such as a fan. This facilitates movement of air throughout the enclosure 100, e.g., entry near the bottom of the enclosure 100, for example via lower sub-section 106, through main chamber 105 and exit to ambient near the upper sub-section 106, as indicated by the dashed arrows of FIG. 1. Alternatively, air circulation may be altered, e.g., via omission of lower sub-section 106 and use of a side panel with a vent attached to an aperture 103, such as illustrated in FIG. 2 at 207, reversing the operation of the air movement mechanism, etc.

Figure 1:
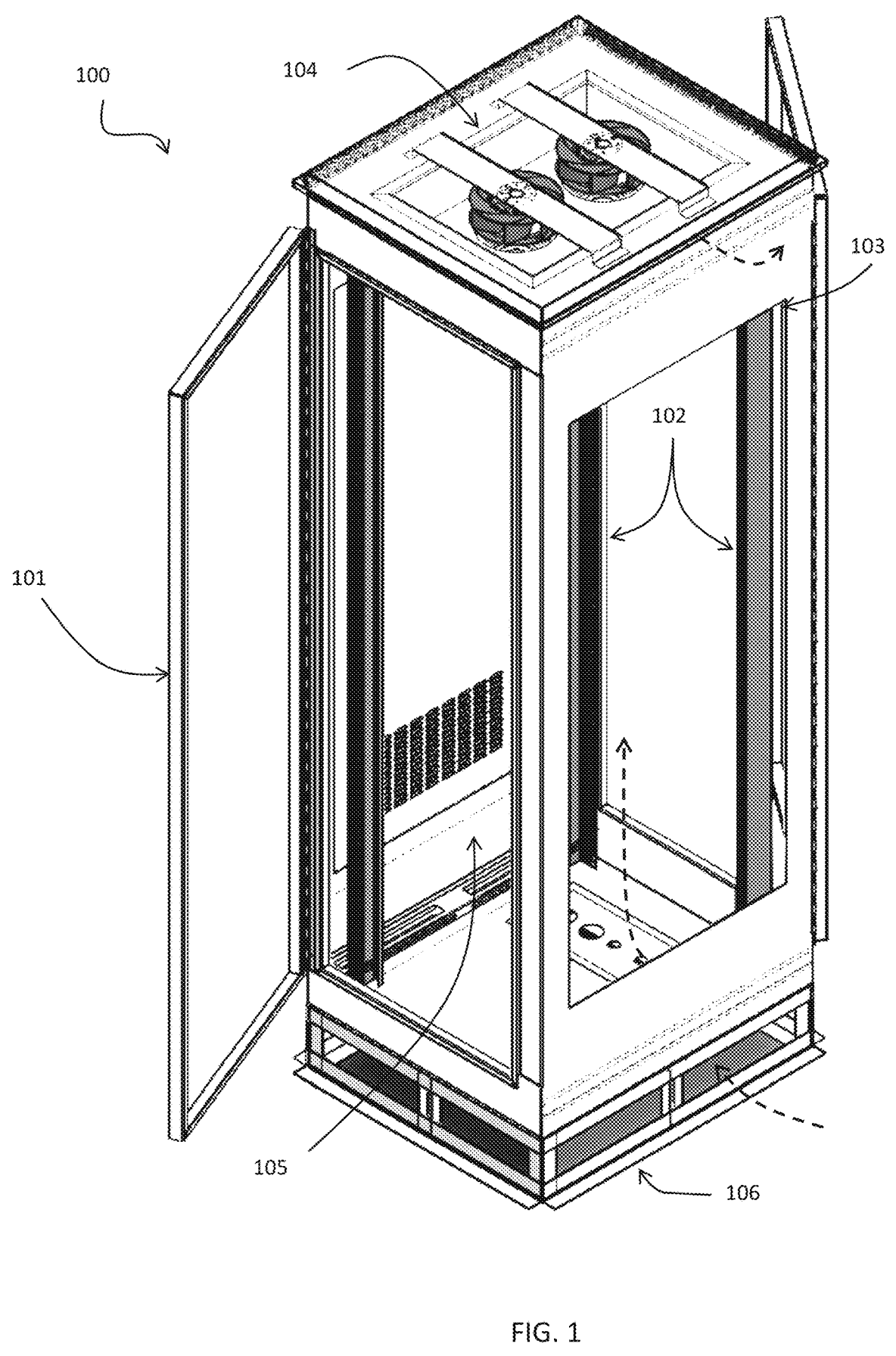

FIG. 1A illustrates the skeletal structure 102*a* with the outer shell of aluminum walls or panels removed. As illustrated in FIG. 1A, in an embodiment, the use of a connecting collar is avoided due to the rigidity imparted to the aluminum walls via the internal skeleton structure 102*a*. This permits one or more of the enclosure walls to feature an aperture or cutout that facilitates use of a cover plate or the removal of the cover plate for securing another enclosure thereto, e.g., via screws, bolts or other securing mechanism and a thin sealing material such as rubber or similar material. In this regard, each aperture of a side, bottom, or top wall or panel having an opening therein may feature a sealing material, for example a rubber seal, that imparts water impermeability and/or insulation to the joint formed with a respective component, such as an adjacent wall of a connected enclosure, a modular air conditioning unit attached to the aperture, etc. In an embodiment, the upper portion, e.g., 404*a* of FIG. 4, may include an internal skeleton made of rigid material, similar to a main or lower portion, 402*a* . A rigid skeleton include in upper portion may facilitate movement, e.g., picking up or lifting, the entire unit by the roof, which may be supplied with venting holes and/or tie in points for mounting brackets used for lifting or securing modular units to one another, as described in connection with FIG. 2.

Figure 2:
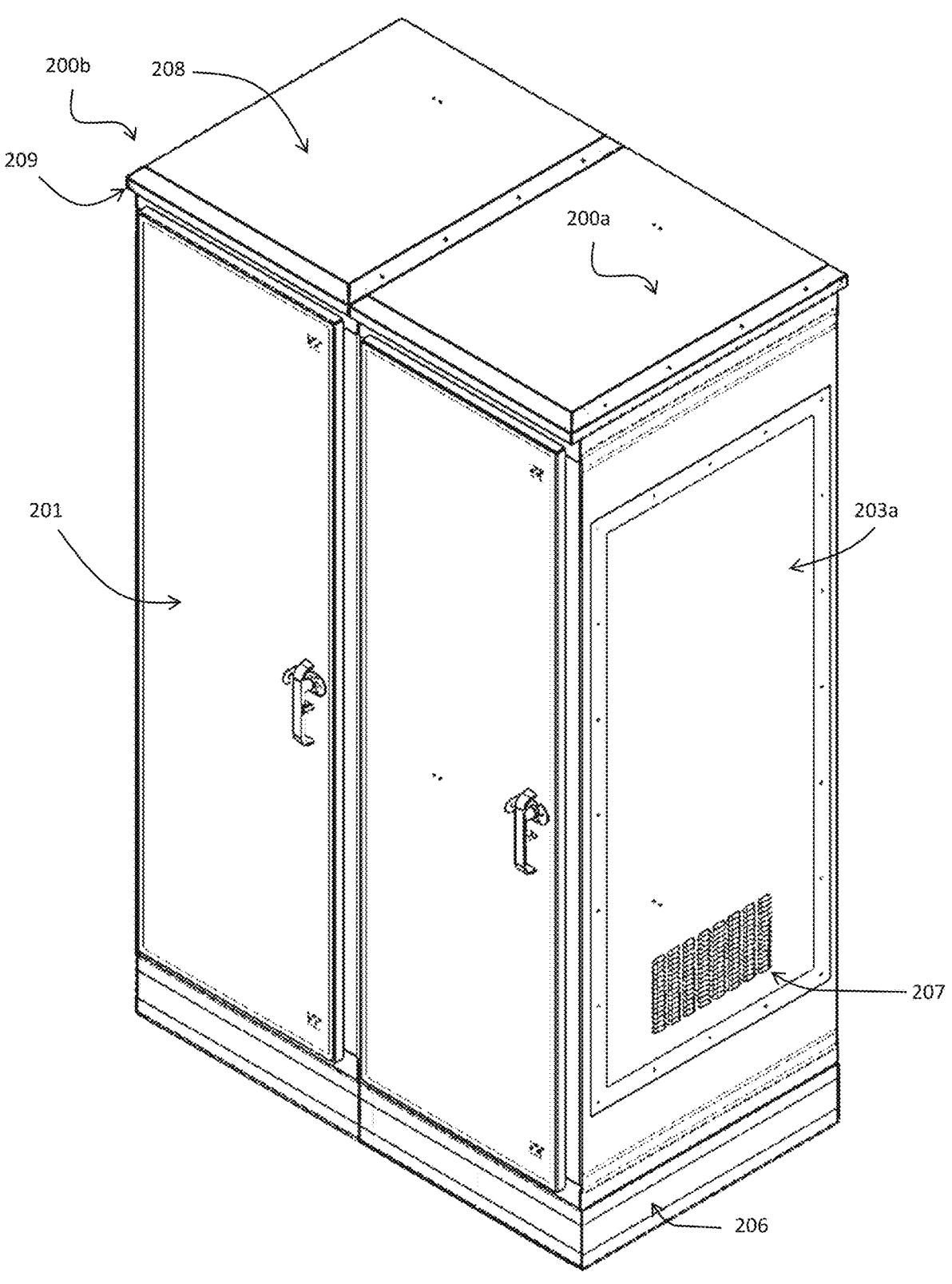
FIG. 2 illustrates an example enclosure.

FIG. 2 illustrates enclosures 200*a*, 200*b* connected in series, e.g., via aperture 103 of FIG. 1. For example, enclosure 200*a* may be fixed or secured to enclosure 200*b* as illustrated in FIG. 2 via a series of attachment mechanism, which may be removable, for example machine or metallic screws with or without a seal, e.g., small rubber or similar sealing strip at the interface of two apertures in the side walls of enclosures 200*a*, 200*b*. It is illustrated in FIG. 2 that lower sub-section 206 may be sealed completely or partially, e.g., via use of blank out plates as illustrated.

Figure 3:
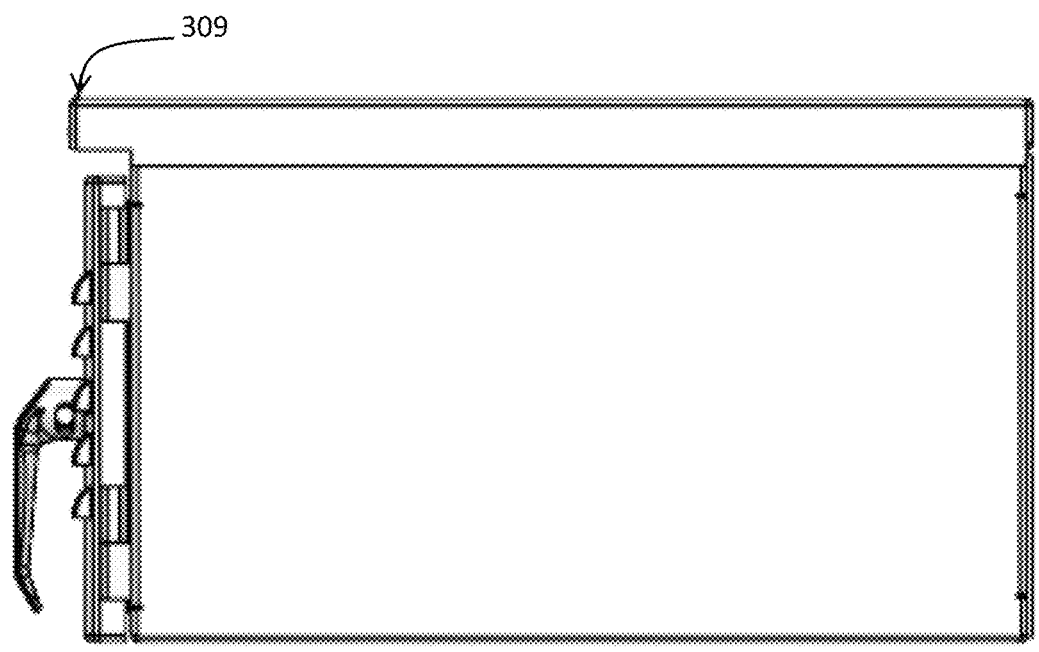
FIG. 3 illustrates a side view of a top of an example enclosure.

FIG. 2 also illustrates that roof(s), one of which is indicated at 208, of enclosures 200*a*, 200*b* may include an overhanging feature on one or more sides, indicated at 209, to facilitate protection of the enclosure's seals, e.g., at door 201, from entry of environmental elements such as precipitation. An example over-hang 309 is illustrated in a side view in FIG. 3.

Figure 4:
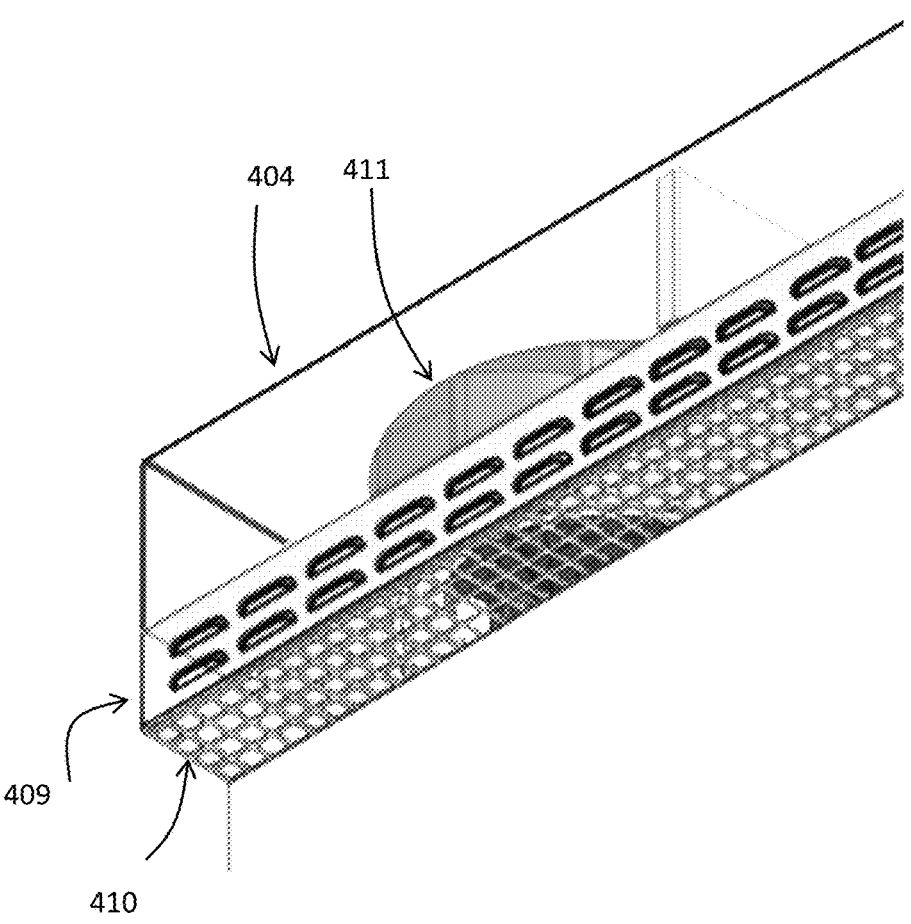
FIG. 4, FIG. 4A, FIG. 4B and FIG. 4C illustrate views of a top of an example enclosure.

Illustrated in FIG. 4 is upper portion 404 from a lower perspective view such that the over-hang 409 may be appreciated from the underside. In FIG. 4, the upper portion 404 is illustrated in a partially transparent manner to allow viewing of certain included components such as fan 411. The underside of over-hang 409 may include features 410 such as a vent, mesh, filter, baffle or other mechanism(s) to prevent entry of environmental contaminates such as precipitation.

Figure 4A:
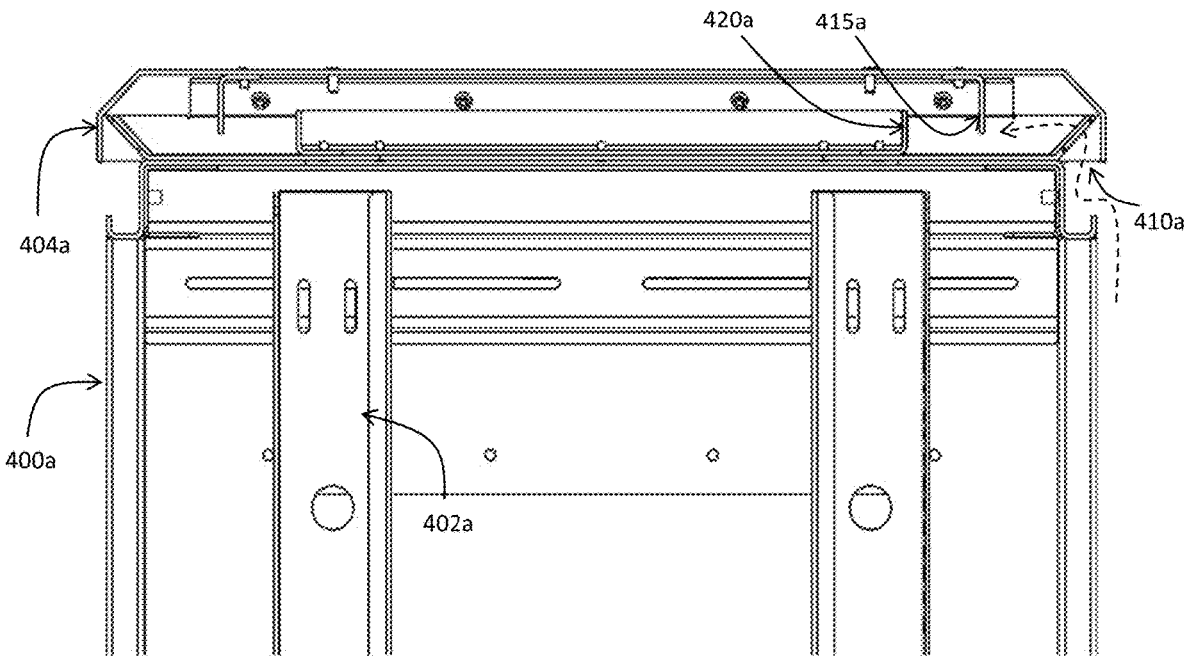

In one example, features 410 may include one or more baffle(s) and hydroscopic filter(s) to support washdown applications, i.e., resistance of water entry even under direct spraying. By way of example, illustrated in FIG. 4A is a side view in cross-section of the upper portion 404*a* and enclosure 400*a*, including a top portion of internal frame 420*a*. In the side view, it may be appreciated that the features 410*a* may include a vent or mesh, as illustrated in FIG. 4, coupled with one or more additional features, such as features to prevent water entry into the upper portion 404. As illustrated, one or more baffles 415*a* may be included, e.g., suspended or emanating from the roof panel of upper portion 404*a*, which permits airflow but acts as a physical barrier to water entry, e.g., along a path shown using the dashed arrow in FIG. 4A. As may be appreciated, one or more filters may be included, such as in front of the baffle 415*a*, behind the baffle 415*a* and between a subframe 420*a*, or a combination of the foregoing. Inclusion of one or more filters permits filtration of particulates.

Figure 4B:
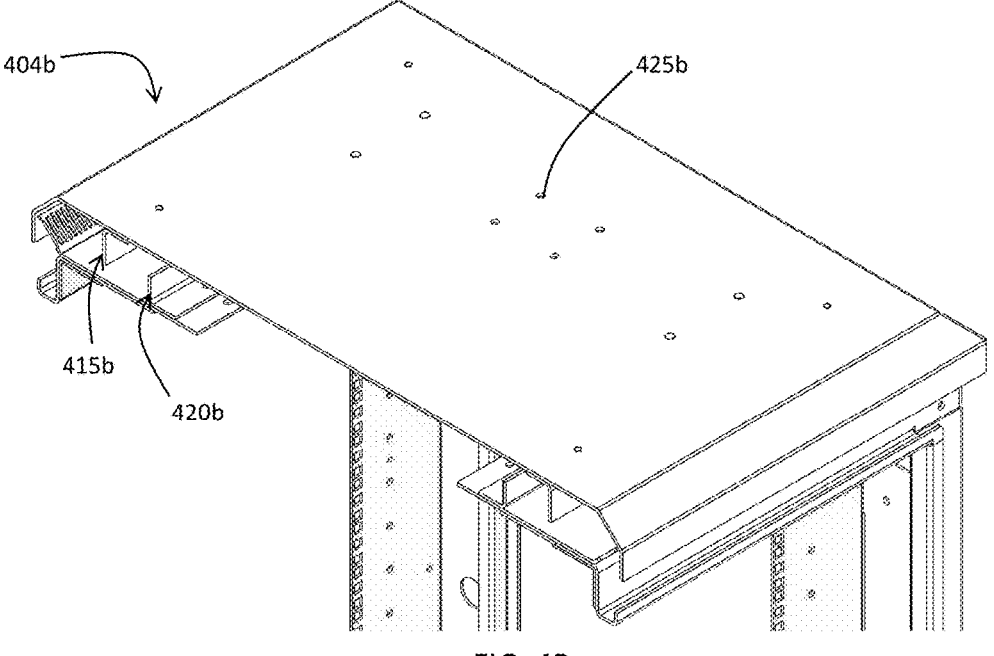
Figure 4C:
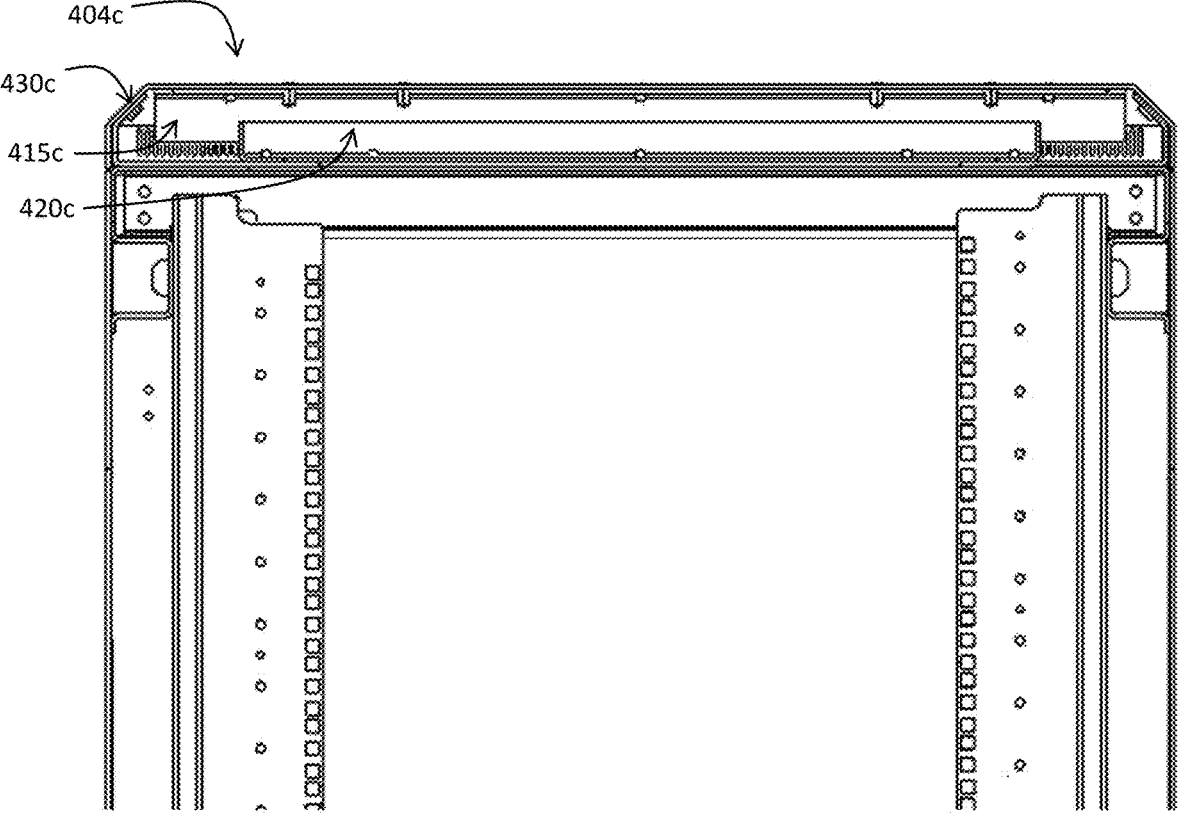

FIG. 4B illustrates a perspective, cut-away view of upper portion 404*b* in which baffle 415*b* and subframe 420*b* may be seen cooperating to disrupt any potential waterflow entry path (refer to FIG. 4A). As shown in FIG. 4B, in an embodiment, a roof of upper portion 404*b* may include one or more vent features, one of which is illustrated at 425*b*.

Shown in the example view of 4C is a cut-away of the upper portion 404*c* in which baffle 415*c* is positioned in front of vent feature 430*c*, which permits airflow therethrough but baffle 415*c* in cooperation with subframe 420*c* prohibits or reduces water entry into upper portion 404*c*.

Figure 5:
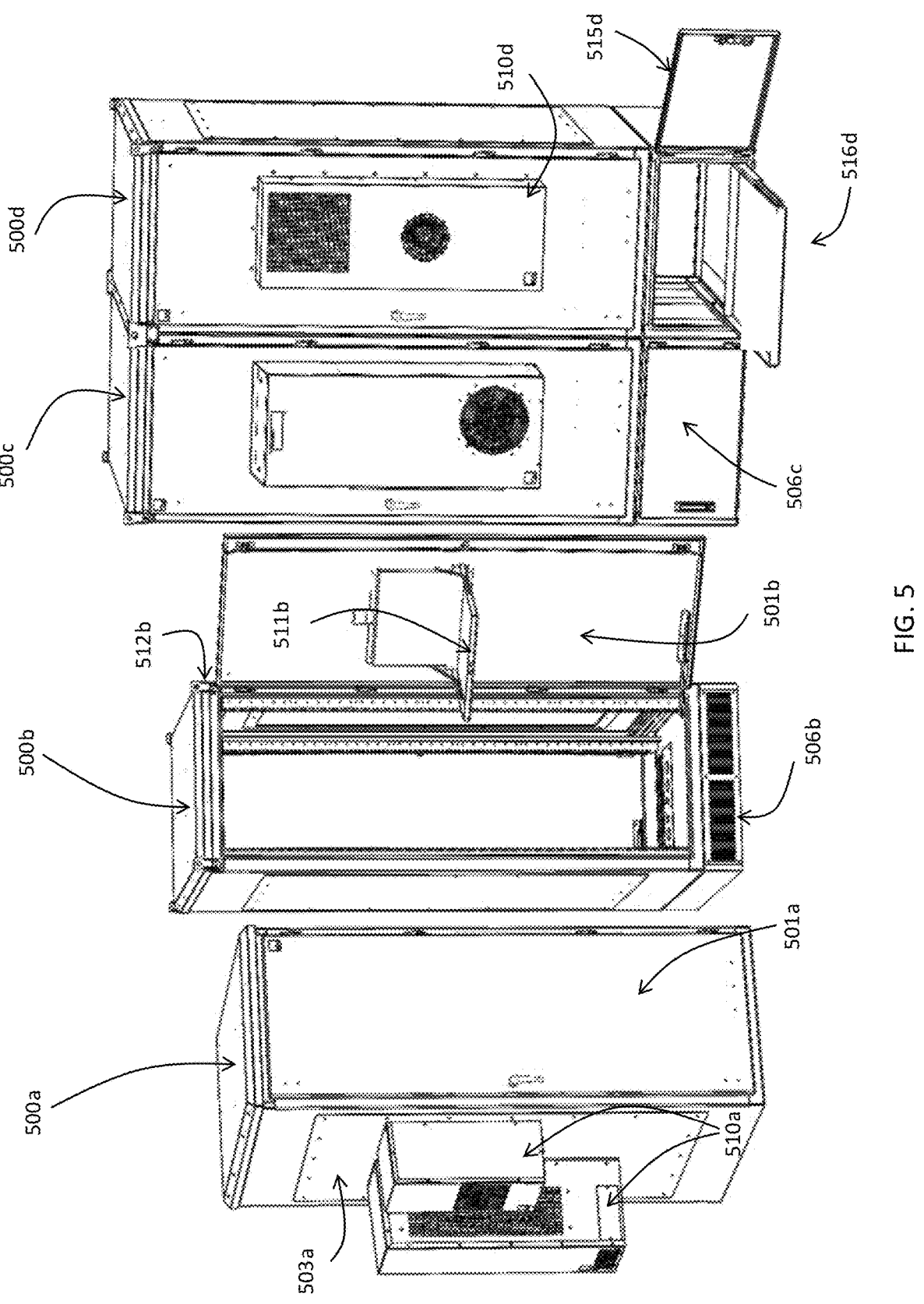
FIG. 5 and FIG. 5A illustrate example enclosures and associated modular components.

To provide a better understanding of the modular nature of the various embodiments, several differently configured enclosures 500*a*, 500*b*, 500*c*, and 500*d* are illustrated in FIG. 5, alone and connected in series (noting that essentially any number of enclosures may be connected in series).

Enclosure 500*a* of FIG. 5 illustrates an example in which upper sub-section (e.g., 104 of FIG. 1) and lower sub-section (e.g., 106 of FIG. 1) are omitted in favor of a shorter overall unit. In such case, roof and floor panels may be blank out panels, sealing the unit entirely for closed-loop cooling. In the example of enclosure 500*a*, door 501*a* is illustrated as sealed or solid, whereas it may include a vent or other feature, as further described herein. Enclosure 500*a* also includes a side panel 503*a* that includes cooling components 510*a*, 510*d*, such as a filtered fan system or side-mount air conditioning unit, e.g., for closed-loop cooling.

Enclosure 500*b* includes lower sub-section 506*b*, which is not a battery box but rather an air intake arrangement, and upper sub-section (e.g., 104 of FIG. 1). In this configuration, air entry may be facilitated through lower sub-section 106 and exit via upper sub-section, but likewise upper sub-section may be omitted and air exit facilitated via a side panel or door 501*b* with a vent, or an attached enclosure (not illustrated). As indicated, enclosure 500*b* may include a door 501*b* with internal features 511*b*, such as a fold out shelf.

Also illustrated in connection with enclosure 500*b* is a lifting attachment 512*b*, which is positioned near the roof of the enclosure 500*b*. The lifting attachment 512*b* may be used to secure a lifting cable or the like for hoisting the enclosure 500*b* into place, e.g., on an outdoor concrete pad. Further, lifting attachment 512*b* is positioned at the margin of the roof of the enclosure such that the door 501*b* is secured into position and is not removable unless rotated a predetermined angle or angular range, e.g., swung open. This secures the door 501*b* in place, but permits its removal if opened to the predetermined angle or angular range, e.g., via lifting upwards and removing it from the exposed upper edge of the hinges.

Enclosures 500*c* and 500*d* are illustrated as connected in series, e.g., via apertures (103 of FIG. 1) in respective side panels. Here, each enclosure includes both upper and lower sub-sections. Lower sub-sections 506*c* is indicated to point out that the lower sub-sections may take the form of battery boxes, e.g., for enclosing batteries that supply emergency or auxiliary power to heat generating components such as telecommunications equipment. As described herein, the battery boxes may be constructed similarly to the main chamber or the enclosures 500*c*, 500*d*, i.e., having a sheet of material such as aluminum reinforced by an internal skeleton made of rigid material such as steel. Further, lower sub-sections may include features such as a door 515*d* and slide out shelving 516*d* to facilitate removable component addition and retrieval, e.g., batteries.

Figure 5A:
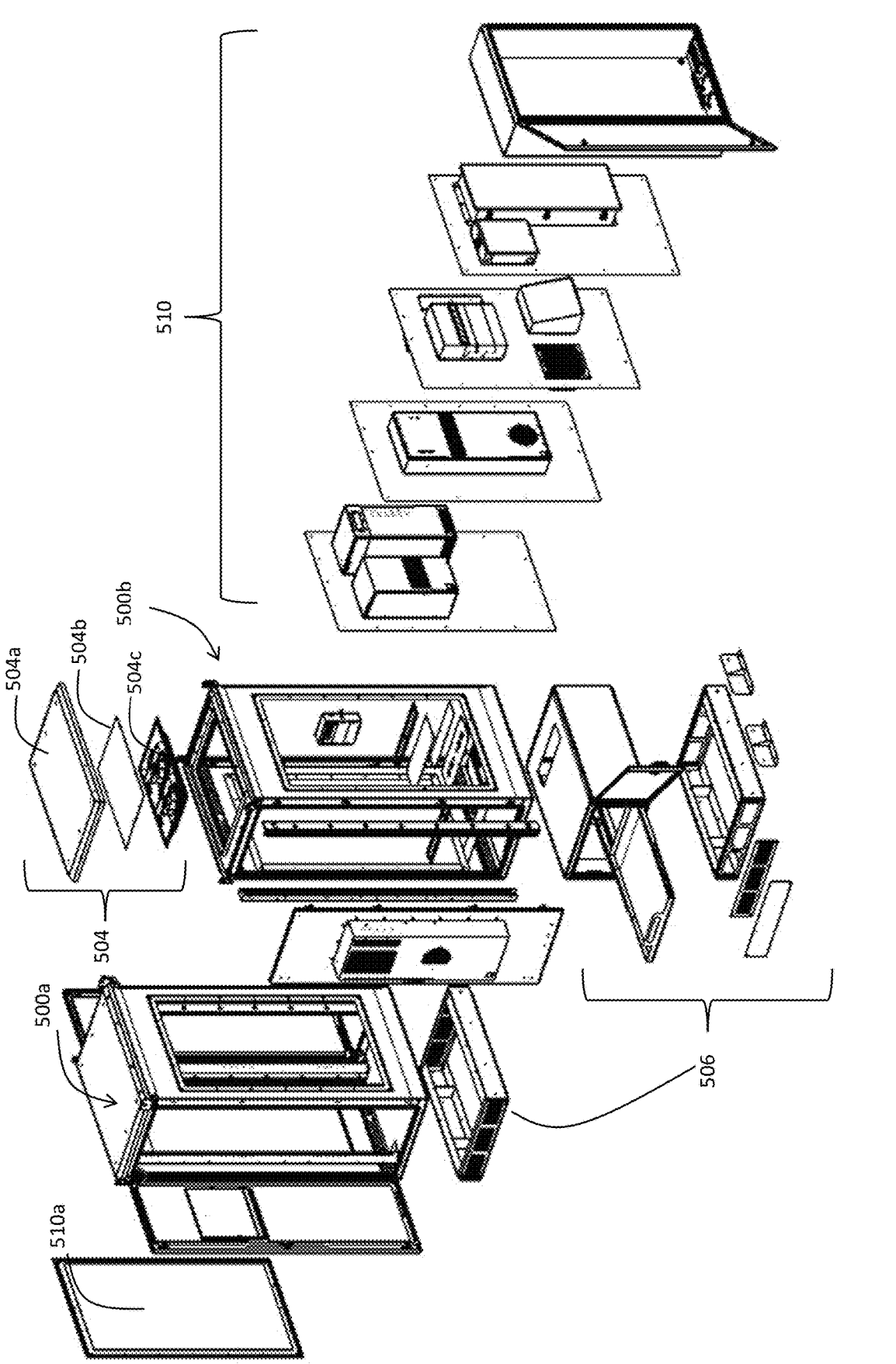

As another example of the modularity of an embodiment, illustrated in FIG. 5A are enclosures 500*a* and 500*b* in an exploded view with potential modular components. Enclosures 500*a*, 500*b* may be configured with a variety of components, for example inclusion of a variety of panel types (collectively indicated at 510), such as panels including air conditioners, heat exchanges, filtered fan system or hoods, and control cabinets. Further, a blank panel 510*a* may be attached. As illustrated, the upper portion 504 may include one or more modular units, for example a tray 504*c* or subframe containing fans, heat exchangers, or the like, a plate 504*b*, and roof 504*a*. Likewise, the lower portion of an enclosure 500*a*, 500*b* may be configured with feet or mounting brackets with tie in holes for attachment to a concrete pad (e.g., via bolts or similar mechanism), a battery box of varying sizes, or a combination of the foregoing (collectively indicated at 506 of FIG. 5A).

Figure 6:
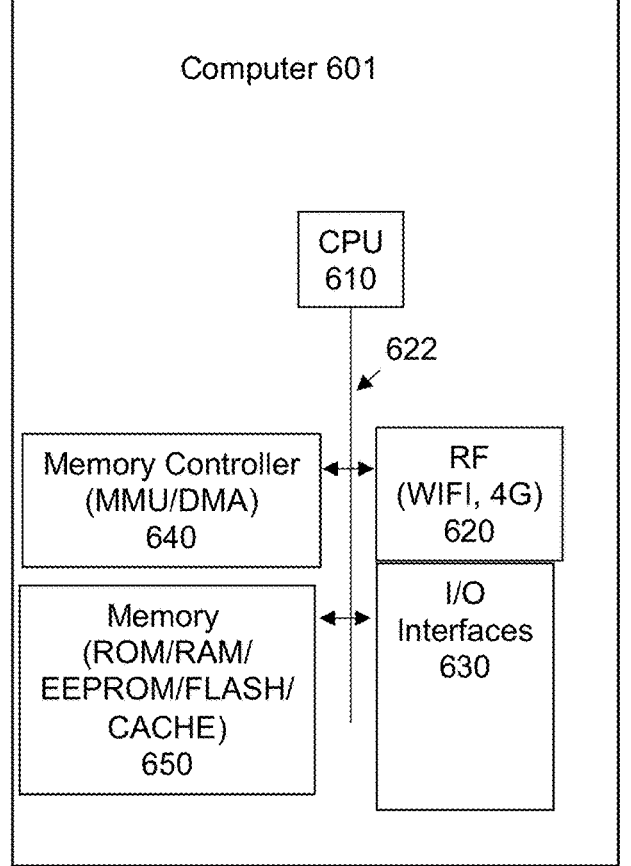
FIG. 6 illustrates an example system.
Figure 6:
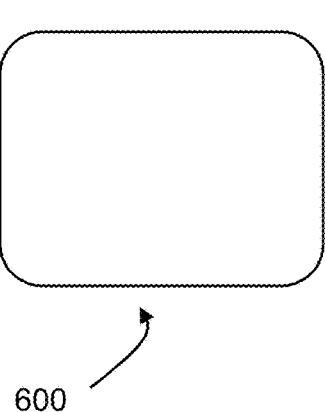

Referring to FIG. 6, an example device that may be used in implementing one or more embodiments includes a controller for a cooling unit included in an enclosure system 600. The controller may be included in the form of a computing device (computer) 601 or a control panel.

The computer 601 may execute program instructions or code or operate using dedicated circuitry configured to process data and perform other functionality of the embodiments. Components of computer 601 may include, but are not limited to, a processing unit 610, which may take a variety of forms such as a central processing unit (CPU), a graphics processing unit (GPU), a programmable circuit or other programmable hardware, non-programmable hardware, a combination of the foregoing, etc., a system memory controller 640 and memory 650, as well as a system bus 622 that couples various system components including the system memory 650 to the processing unit. It is noted that in certain implementations, computer 601 may take a reduced or simplified form, such as a micro-control unit implemented in a control panel of a cooling system, where certain of the components of computer are omitted or combined.

The computer 601 may include or have access to a variety of non-transitory computer readable media. The system memory 650 may include non-transitory computer readable storage media in the form of volatile and/or nonvolatile memory devices such as read only memory (ROM) and/or random-access memory (RAM). By way of example, and not limitation, system memory 650 may also include an operating system, application programs, other program modules, and program data. For example, system memory 650 may include application programs such as variable speed control software and/or air conditioner operational software for implementing various cooling protocols. Data may be transmitted by wired or wireless communication, e.g., to or from first device to another device, e.g., communication between a remote device or system and computer 601.

A user can interface with (for example, enter commands and information) the computer 601 through input/output (I/O) interfaces 630 using devices such as a touch screen, keypad, etc. A monitor or other type of display screen or device may also be connected to the system bus 622 via an interface. The computer 601 may operate in a networked or distributed environment using logical connections to one or more other remote computers or databases. The logical connections may include a network, such local area network (LAN) or a wide area network (WAN) but may also include other networks/buses. Communication may be facilitated via wireless communication devices, such as radio frequency (RF) devices 620.

It should be noted that various functions described herein may be implemented using processor executable instructions stored on a non-transitory storage medium or device or using dedicated circuitry, e.g., programmable circuits. A non-transitory storage device may be, for example, an electronic, electromagnetic, or semiconductor system, apparatus, or device, or any suitable combination of the foregoing. More specific examples of a non-transitory storage medium include the following: a portable computer diskette, a hard disk, a random-access memory (RAM), a read-only memory (ROM), an erasable programmable read-only memory (EPROM or Flash memory), a portable compact disc read-only memory (CD-ROM), a solid-state drive, or any suitable combination of the foregoing. In the context of this document "non-transitory" media includes all media except non-statutory signal media.

Program code embodied on a non-transitory storage medium may be transmitted using any appropriate medium, including but not limited to wireless, wireline, optical fiber cable, RF, etc., or any suitable combination of the foregoing.

Program code for carrying out operations may be written in any combination of one or more programming languages. The program code may execute entirely on a single device, partly on a single device, as a stand-alone software package, partly on single device and partly on another device, or entirely on the other device. In some cases, the devices may be connected through any type of connection or network, including a local area network (LAN) or a wide area network (WAN), a personal area network (PAN) or the connection may be made through other devices (for example, through the Internet using an Internet Service Provider), through wireless connections, or through a hard wire connection, such as over a USB or another power and data connection.

It is worth noting that while specific elements are illustrated in the figures, and a particular ordering or organization of elements or steps has been illustrated, these are non-limiting examples. In certain contexts, two or more elements or steps may be combined into an equivalent element or step, an element or step may be split into two or more equivalent elements or steps, or certain elements or steps may be re-ordered or re-organized or omitted as appropriate, as the explicit illustrated examples are used only for descriptive purposes and are not to be construed as limiting.

As used herein, the singular "a" and "an" may be construed as including the plural "one or more" unless clearly indicated otherwise.

The use of the term "about" or similar relative term in connection with numbers shall include a range formed by rounding of a base number an increment of the nearest least significant digits, e.g., "about" 29 includes a range of values from 28-30.

This disclosure has been presented for purposes of illustration and description but is not intended to be exhaustive or limiting. Many modifications and variations will be apparent to those of ordinary skill in the art. The example embodiments were chosen and described in order to explain principles and practical application, and to enable others of ordinary skill in the art to understand the disclosure for various embodiments with various modifications as are suited to the particular use contemplated.

Thus, although illustrative example embodiments have been described herein with reference to the accompanying figures, it is to be understood that this description is not limiting and that various other changes and modifications may be affected by one skilled in the art without departing from the scope or spirit of the disclosure.

What is claimed is:

1. An enclosure system, comprising:
a first frame system comprising:
   one or more frame components forming an internal skeleton;
   the one or more frame components having a first rigidity; and
   an external shell comprising one or more shell components that are configured to reversibly attach to the first frame system;
the one or more shell components having a second rigidity, the second rigidity being lower than the first rigidity,
wherein at least one of the one or more shell components of the first frame system comprises a wall attached to the one or more frame components, the wall comprising an aperture and sealing material;
a cover plate reversibly attached to the aperture; and
a modular component that reversibly attaches to the aperture of the at least one of the one or more shell components in place of the cover plate.

2. The enclosure system of claim 1, wherein the modular component comprises one or more of an air conditioning unit, a heat exchanger, and a filtered fan system;
   wherein the one or more of an air conditioning unit, a heat exchanger, and a filtered fan system reversibly attaches to the aperture of the at least one of the one or more shell components.

3. The enclosure system of claim 1, wherein the one or more shell components comprise one or more of an air conditioning unit, a heat exchanger, and a filtered fan system.

4. The enclosure system of claim 3, wherein the one or more of the air conditioning unit, the heat exchanger, and the filtered fan system is integrated into a panel of the one or more shell components.

5. The enclosure system of claim 1, wherein the one or more frame components are formed of steel having a rigidity of about 29 million PSI.

6. The enclosure system of claim 1, wherein the one or more shell components are formed of aluminum having a rigidity of about 10 million PSI.

7. The enclosure system of claim 1, wherein the one or more shell components comprise one or more of a top portion and a bottom portion.

8. The enclosure system of claim 7, wherein the top portion comprises one or more of a fan, a baffle, and a lifting attachment.

9. The enclosure system of claim 1, wherein the bottom portion forms one or more battery boxes.

10. A method, comprising:
providing an enclosure system, including:
   a first frame system comprising one or more frame components forming an internal skeleton;
   the one or more frame components having a first rigidity; and
   an external shell comprising one or more shell components that are configured to reversibly attach to the first frame system;
   the one or more shell components having a second rigidity, the second rigidity being lower than the first rigidity;
   wherein at least one of the one or more shell components of the first frame system comprises a wall attached to the one or more frame components, the wall comprising an aperture and sealing material;
reversibly attaching a cover plate to the aperture;
providing a modular component that reversibly attaches to the aperture of the at least one of the one or more shell components in place of the cover plate; and
attaching one or more of an air conditioning unit, a heat exchanger, and a filtered fan system to a panel of the modular component.

11. The method of claim 10, comprising reversibly connecting the enclosure system to another enclosure system via the cover plate and sealing material without use of a connecting collar.

* * * * *